(12) United States Patent
Simmons

(10) Patent No.: US 9,692,439 B2
(45) Date of Patent: Jun. 27, 2017

(54) APPARATUS USING A DIFFERENTIAL ANALOG-TO-DIGITAL CONVERTER

(75) Inventor: Martin John Simmons, Ensign Way (GB)

(73) Assignee: Atmel Corporation, San Jose, CA (US)

( * ) Notice: Subject to any disclaimer, the term of this patent is extended or adjusted under 35 U.S.C. 154(b) by 122 days.

(21) Appl. No.: 13/593,982

(22) Filed: Aug. 24, 2012

(65) Prior Publication Data

US 2012/0319995 A1 Dec. 20, 2012

Related U.S. Application Data

(63) Continuation of application No. 12/492,856, filed on Jun. 26, 2009, now Pat. No. 8,253,706.

(51) Int. Cl.
| | | |
|---|---|---|
| *G06F 3/045* | (2006.01) | |
| *G06F 3/046* | (2006.01) | |
| *H03M 1/12* | (2006.01) | |
| *G06F 3/041* | (2006.01) | |
| *G06F 3/044* | (2006.01) | |
| *H03K 17/96* | (2006.01) | |

(52) U.S. Cl.
CPC .......... *H03M 1/1245* (2013.01); *G06F 3/044* (2013.01); *G06F 3/0418* (2013.01); *H03K 17/962* (2013.01); *H03K 2217/960705* (2013.01)

(58) Field of Classification Search
CPC .... G06F 3/0418; G06F 3/044; G06F 3/03545; H03K 17/962; H03K 2217/960705; H03M 1/1245
USPC ..... 345/173, 87, 94, 156, 157, 174; 341/156
See application file for complete search history.

(56) References Cited

U.S. PATENT DOCUMENTS

| | | | |
|---|---|---|---|
| 5,757,363 A | 5/1998 | Oishi et al. | |
| 5,805,147 A | 9/1998 | Tokioka et al. | |
| 6,417,846 B1 | 7/2002 | Lee | |
| 6,445,329 B1 * | 9/2002 | Abassi et al. | 341/156 |
| 6,452,514 B1 | 9/2002 | Philipp | |
| 6,486,871 B1 * | 11/2002 | Marten | 345/157 |
| 7,532,202 B2 | 5/2009 | Roberts | |
| 7,663,607 B2 | 2/2010 | Hotelling | |
| 7,864,503 B2 | 1/2011 | Chang | |

(Continued)

FOREIGN PATENT DOCUMENTS

| | | |
|---|---|---|
| CN | 1659583 A | 8/2005 |
| CN | 1797308 A | 7/2006 |

(Continued)

OTHER PUBLICATIONS

Chinese First Office Action and English Translation of Text of First Office Action by State Intellectual Property Office regarding Application No. 201010215300.3; ref. 2013112901133230 dated Dec. 4, 2013, (17 pgs.).

(Continued)

*Primary Examiner* — Andrew Sasinowski
*Assistant Examiner* — Kuo Woo
(74) *Attorney, Agent, or Firm* — Baker Botts L.L.P.

(57) ABSTRACT

Electronic apparatus and methods of operating the electronic apparatus include less than a frequency associated with a generated waveform. In various embodiments, an apparatus using a differential analog-to-digital converter can perform low frequency noise rejection that can be implemented in a variety of applications. Additional apparatus, systems, and methods are disclosed.

20 Claims, 2 Drawing Sheets

(56) References Cited

U.S. PATENT DOCUMENTS

| | | |
|---|---|---|
| 7,875,814 B2 | 1/2011 | Chen |
| 7,920,129 B2 | 4/2011 | Hotelling |
| 8,031,094 B2 | 10/2011 | Hotelling |
| 8,031,174 B2 | 10/2011 | Hamblin et al. |
| 8,031,180 B2 | 10/2011 | Miyamoto et al. |
| 8,040,326 B2 | 10/2011 | Hotelling |
| 8,049,732 B2 | 11/2011 | Hotelling |
| 8,179,381 B2 | 5/2012 | Frey |
| 8,179,732 B2 | 5/2012 | Frey |
| 8,217,902 B2 | 7/2012 | Chang |
| 2002/0089491 A1* | 7/2002 | Willig .......................... 345/173 |
| 2003/0132902 A1 | 7/2003 | Miyamoto |
| 2004/0183787 A1 | 9/2004 | Geaghan et al. |
| 2004/0217945 A1 | 11/2004 | Miyamoto et al. |
| 2007/0139385 A1* | 6/2007 | Inokuchi ....................... 345/173 |
| 2008/0309635 A1 | 12/2008 | Matsuo |
| 2009/0244014 A1 | 10/2009 | Hotelling et al. |
| 2009/0315854 A1 | 12/2009 | Matsuo |
| 2010/0045635 A1 | 2/2010 | Soo |
| 2010/0060589 A1 | 3/2010 | Wilson |
| 2010/0321338 A1* | 12/2010 | Ely ..................... G06F 3/03545 345/174 |
| 2011/0242048 A1* | 10/2011 | Guedon .................. G06F 3/044 345/174 |
| 2012/0242588 A1 | 9/2012 | Myers |
| 2012/0242592 A1 | 9/2012 | Rothkopf |
| 2012/0243151 A1 | 9/2012 | Lynch |
| 2012/0243719 A1 | 9/2012 | Franklin |
| 2013/0076612 A1 | 3/2013 | Myers |

FOREIGN PATENT DOCUMENTS

| | | |
|---|---|---|
| CN | 101185055 A | 5/2008 |
| WO | WO 2012/129247 | 9/2012 |

OTHER PUBLICATIONS

U.S. Appl. No. 61/454,936, filed Mar. 21, 2011, Myers.
U.S. Appl. No. 61/454,950, filed Mar. 21, 2011, Lynch.
U.S. Appl. No. 61/454,894, filed Mar. 21, 2011, Rothkopf.

* cited by examiner

APPARATUS USING A DIFFERENTIAL ANALOG-TO-DIGITAL CONVERTER

RELATED APPLICATIONS

This nonprovisional application is a continuation of U.S. application Ser. No. 12/492,856, filed Jun. 26, 2009, and entitled "Apparatus Using a Differential Analog-To-Digital Converter."

BACKGROUND

Touch screens are widely being used in a variety of electronic devices and systems. Meeting the needs of consumers of such electronic devices and systems is driving the industry to provide touch screens with appropriately increased sensitivity and ease of use.

BRIEF DESCRIPTION OF THE DRAWINGS

Embodiments of the invention are illustrated by way of example and not limitation in the example figures of the accompanying drawings in which.

DETAILED DESCRIPTION

The following detailed description refers to the accompanying drawings that show, by way of illustration, various embodiments. These embodiments are described in sufficient detail to enable those skilled in the art to practice these and other embodiments. Other embodiments may be utilized, and structural, logical, and electrical changes may be made to these embodiments. Various embodiments are not necessarily mutually exclusive, as some embodiments can be combined with one or more other embodiments to form new embodiments. The following detailed description is, therefore, not to be taken in a limiting sense.

Figure 1:
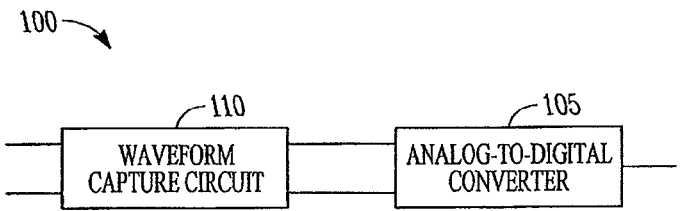
FIG. 1 illustrates a block diagram of an example embodiment of an apparatus using a differential analog-to-digital converter.

FIG. 1 illustrates a block diagram of an example embodiment of an apparatus 100 using a differential analog-to-digital converter (ADC) 105. Apparatus 100 also includes a waveform capture circuit 110. A waveform capture circuit provides a mechanism for acquiring characteristic features of a waveform. Such characteristics include, but are not limited to, a maximum amplitude, a minimum amplitude, a phase, or other features of the waveform. Waveform capture circuit 110 can be arranged to capture a characteristic of the waveform varying in one direction and an associated characteristic varying in a different direction. For example, waveform capture circuit 110 can acquire the maximum amplitude of a periodic waveform and the minimum amplitude of the same periodic waveform, where the maximum and minimum are associated with the same period. For example, waveform capture circuit 110 can acquire the rising edge of a pulse and the falling edge of a pulse and/or representations of the rising and falling edges. In various embodiments, waveform capture circuit 110 can acquire a response of a circuit component to the rising edge of an input pulse and the response of the circuit component to the falling edge of the input pulse and/or representations of these responses.

Waveform capture circuit 110 can be structured to manipulate waveforms to extract relevant information or representations of the waveforms. For example, a rising edge of a voltage pulse and a falling edge of the voltage pulse are correlated to a maximum voltage. Noise or low frequency interference concurrent with the pulse, or a response to the pulse, is typically common to the rising edge and the falling edge. Waveform capture circuit 110 can operate on the pulse, or a response to the pulse, to provide pulses of opposite polarity with associated common noise or low frequency interference of the same polarity. Subtraction of the two pulses effectively reduces or eliminates the associated common noise or low frequency interference and can double the dynamic range associated with the rising and falling edges of the pulse.

As shown in FIG. 1, ADC 105 is coupled to waveform capture circuit 110. ADC 105 can be configured with inputs coupled to waveform capture circuit 110 to receive a representation of a characteristic varying in the one direction and to receive a representation of an associated characteristic varying in the different direction. Differential ADC 105 can remove signal components common to both directions. In many instances such common components tend to be noise. With a waveform being a pulse, the characteristic varying in one direction can be a rising edge of the pulse and the associated characteristic varying in a different direction can be a falling edge of the pulse. With the waveform being an input pulse, the rising edge and falling edge applied to waveform capture circuit 110 can be responses to an input waveform to a circuit coupled to waveform capture circuit 110.

In various embodiments, waveform capture circuit 110 includes sample and hold circuits. The sample and hold circuits can be coupled to an amplifier such that waveform capture circuit 110 is arranged to provide a representation of a rising edge of a pulse and a representation of a falling edge of a pulse. The amplifier can be realized as a virtual earth amplifier.

Figure 2:
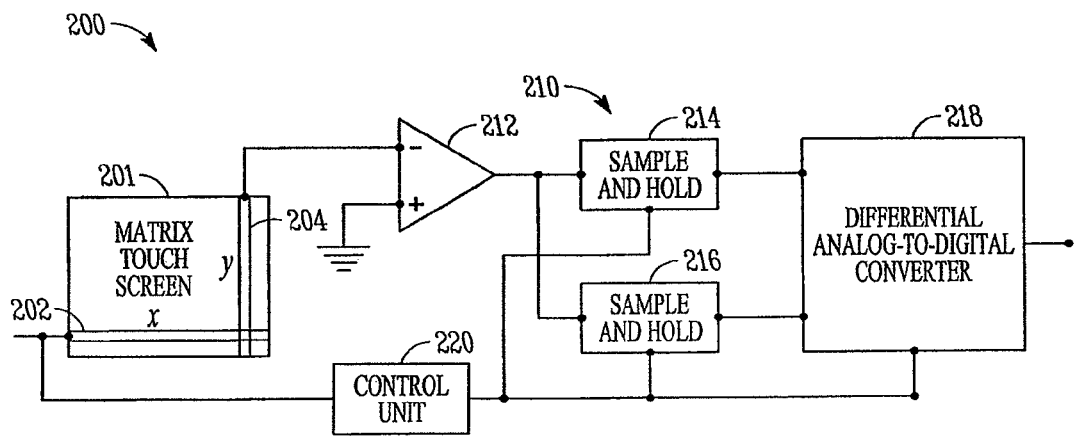
FIG. 2 shows a block diagram of features of an example embodiment of an apparatus having a matrix touch screen coupled to a circuit to measure charge transfer.

FIG. 2 shows a block diagram of features of an example embodiment of an apparatus 200 having a matrix touch screen 201 coupled to a circuit 210 to measure charge transfer. Matrix touch screen 201 includes drive electrodes 202, referred to as X lines or X electrodes, that are capacitively coupled to receive electrodes 204, referred to as Y lines or Y electrodes. For ease of discussion, only one X electrode 202 and one Y electrode 204 are shown. The X drive electrode 202 is separated form the Y electrode 204 by dielectric material. Without any disturbance in the physical arrangement, a signal received at Y electrode 204 in response to a signal applied to X electrode 202 is based on the capacitive coupling determined by the physical arrangement and the materials of the matrix touch screen 201. Contact with matrix touch screen 201, such as by human touch, alters the capacitive relationship between X electrode 202 and Y electrode 204, which affects charge transfer associated with a signal applied to X electrode 202. Charge transfer associated with the capacitive coupling between X electrode 202 and Y electrode 204 can be measured using circuit 210. In various embodiments, circuit 210 is configured to reject low frequency interference in the measurement of charge transfer associated with matrix touch screen 201. Circuit 210 can be arranged such that it is independent of the physical structure and design of matrix touch screen 201 and its components such as drive X electrodes 202 and receive Y electrodes 204. As a result, circuit 210 can be used with a variety of touch screens. Portions or all of circuit 210 can be integrated with matrix touch screen 201. Alternatively, portions or all of circuit 210 can be integrated with one or more other components separate from matrix touch screen 201.

In various example embodiments, circuit 210 includes an amplifier 212, a sample and hold circuit 214, a sample and hold circuit 216, and a differential analog-to-digital converter (ADC) 218. Amplifier 212 can be realized as a virtual earth amplifier. A virtual earth amplifier 212 can be used as a charge integration amplifier with respect to Y output line 204. Coupling differential ADC 218 to a virtual earth amplifier in circuit 210 to measure charge transfer provides a mechanism to reject low frequency interference during the measurement of the charge transfer associated with matrix touch screen 201.

As shown in FIG. 2, virtual earth amplifier 212 connected to Y line 204 on matrix touch screen 201 operatively collects charge and generates a negative voltage offset in response to a rising signal on X line 202 on matrix touch screen 201. The resulting voltage from virtual earth amplifier 212 can be held by sample and hold circuit 214 coupled to virtual earth amplifier 212. A maximum value of the resulting voltage in a particular direction can be held. Lowering the signal on the X line then results in a positive offset from virtual earth amplifier 212, which can be received and held in sample and hold circuit 216. For a pulse applied to X line 202, each edge of the pulse will produce a pulse in a particular direction out of virtual earth amplifier 212. A positive (rising) edge will produce a negative going pulse out of virtual earth amplifier 212 and a negative (falling) edge will produce a positive pulse out of virtual earth amplifier 212. Differential ADC 218, coupled to sample and hold circuit 214 and sample and hold circuit 216, operatively measures the difference between the two voltages associated with the rising signal and the falling signal on X line 202. Sample and hold circuits 214 and 216 are controlled to provide a mechanism for providing the positive and negative outputs from virtual earth amplifier 212 to differential ADC 218 substantially concurrently.

Circuit 210 can operatively perform charge collection on both edges of a pulse generated by X line 202. Charge collection on both edges of a pulse allows a doubling of the dynamic range for charge measurement at the output of the ADC 218. In addition, direct current (DC) offsets in measurement circuit 210 or interference at a frequency substantially lower than the frequency of a signal on X line 202 tend to cause an equal change in both halves of the measurement and can be removed when the differential measurement is taken at ADC 218.

Apparatus 200 can also include a control unit 220 to manage the charge measurement associated with pulses applied to X lines 202 of matrix touch screen 201 such that the measurement using the output of ADC 218 is synchronized. Control unit 220 can be configured to apply pulses to X lines 202. Alternatively, control unit 220 can be arranged to use and control measurement from pulse generation by another drive source.

By operating on the response to the dual edge of a waveform applied to the X input line 202 using the differential ADC 218, low frequencies of noise relative to the frequency of the waveform can be rejected. Using differential ADC 218 and dual edge charge transfer associated with a rising edge and a falling edge of a pulse can provide for low frequency noise rejection in charge measurement from a touch screen. In addition, differential ADC 218 can generate enhanced dynamic resolution to the charge measurement.

A charge measurement can be conducted with a pulse on an X line. Each pulse has a positive and a negative edge. A positive edge will generate a negative signal and a negative edge will generate a positive signal or visa versa, depending on the circuit. Sampling the signal from the positive edge, a signal from the measurement plus some value from low frequency interference is acquired. The signal with respect to the positive edge can be represented by $$S_P = -M + L,$$

where M is the measurement and L is from the low frequency interference.

The signal with respect to the negative edge is acquired as $$S_N = +M + L.$$

Note that L will be the same for frequencies much slower than the measurement. With $S_P$ and $S_N$ fed into differential ADC 218, differential ADC 218 provides a measurement with the output of a signal given by $$S_{ADC} = (+M+L) - (-M+L) = 2M.$$

This ADC measurement can be viewed as being the same as subtracting the two edge-based signals during the conversion. As shown above, the architecture of circuit 210 can provide for the essential elimination of the low frequency noise, common to both edges of the pulse, while doubling the signal measurement.

Figure 3:
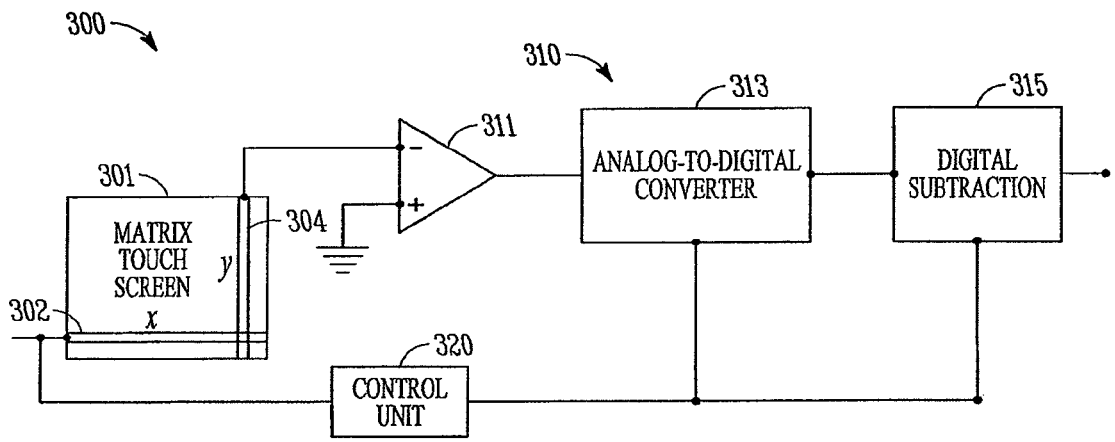
FIG. 3 shows a block diagram of features of an example embodiment of an apparatus having a matrix touch screen coupled to a circuit to measure charge transfer.

FIG. 3 shows a block diagram of features of an example embodiment of an apparatus 300 having a matrix touch screen 301 coupled to a circuit 310 to measure charge transfer. Matrix touch screen 301 includes drive electrodes 302 that are capacitively coupled to receive electrodes 304. For ease of discussion, only one X electrode 302 and one Y electrode 304 are shown, similar to the discussion with respect to FIG. 2. Similar to apparatus 200 of FIG. 2, operation of matrix touch screen 301 is based on capacitive coupling between X drive lines 302 and Y output lines 304. Charge transfer associated with the capacitive coupling between X line 302 and Y line 304 can be measured using circuit 310. Circuit 310 can be arranged such that it is independent of the physical structure and design of matrix touch screen 301 and its components such as drive X electrodes 302 and receive Y electrodes 304. As a result, circuit 310 can be used with a variety of touch screens. Portions or all of circuit 310 can be integrated with matrix touch screen 301. Alternatively, portions or all of circuit 310 can be integrated with one or more other components separate from matrix touch screen 301.

In various example embodiments, circuit 310 includes an amplifier 311, an analog-to-digital converter (ADC) 313, and a digital subtraction unit 315. Amplifier 311 can be realized as a virtual earth amplifier. A virtual earth amplifier 311 can be used as a charge integration amplifier with respect to Y output line 304. In operation, virtual earth amplifier 311 connected to Y line 304 on matrix touch screen 301 operatively collects charge and generates a negative voltage offset in response to a rising signal on X line 302 on matrix touch screen 301. The resulting voltage from virtual earth amplifier 311 can be sent directly to ADC 313. Lowering the signal on the X line then results in a positive offset from virtual earth amplifier 311, which can be sent directly to ADC 313. ADC 313 provides, to digital subtraction unit 315, digital representations of the two voltages received from virtual earth amplifier 311. Digital subtraction unit 315 can be realized in a number of conventional or equivalent formats. Output of digital subtraction unit 315 is used in the measurement of charge transfer associated with a signal driven on X input line 302 capacitively coupled to receive Y line 304 of matrix touch screen 301. Circuit 310 can operatively perform charge collection on both edges of a pulse generated at X line 302 in which digital subtraction provides for low frequency rejection in the charge measurement.

Apparatus 300 can also include a control unit 320 to manage the charge measurement associated with pulses applied to X lines 302 of matrix touch screen 301 such that the measurement using the output of ADC 313 is synchronized. Control unit 320 can be configured to apply pulses to X lines 302. Alternatively, control unit 320 can be arranged to use and control measurement from pulse generation by another drive source.

Circuit 210 of FIG. 2 effectively uses subtraction in analog format. Circuit 310 of FIG. 3, on the other hand, conducts subtraction in a digital format. In various embodiments, use of sample and hold circuits with a differential analog-to-digital converter similar to the example shown in FIG. 2 can provide better resolution than embodiments using digital subtraction similar to the example shown in FIG. 3.

Figure 4:
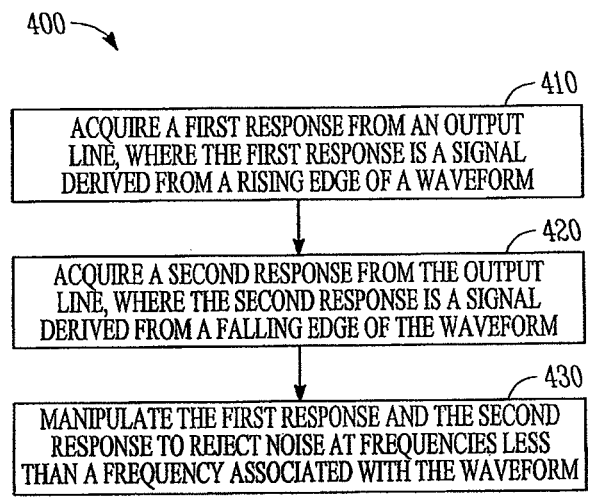
FIG. 4 shows features of an example embodiment of a method for low frequency noise rejection.

FIG. 4 shows features of an example embodiment of a method for low frequency noise rejection. At 410, a first response is acquired from an output line, where the first response is a signal derived from a rising edge of a waveform. The first response can be acquired from an output line of a matrix touch screen, where the first response includes a capacitively induced signal derived from a rising edge of a pulse applied to an input line of the matrix touch screen.

At 420, a second response is acquired from the output line, where the second response is a signal derived from a falling edge of the waveform. The second response can be acquired from the output line of the matrix touch screen, where the second response includes a capacitively induced signal derived from a falling edge of the pulse applied to the input line of the matrix touch screen.

At 430, the first response and the second response are manipulated to reject noise at frequencies less than a frequency associated with the waveform. Manipulation of the first response and the second response can be applied with respect to a pulse applied to the input line of the matrix touch screen such as to reject noise at frequencies less than a frequency associated with the pulse. Such manipulation can include a subtraction between a digital representation of the first response and a digital representation of the second response. Other manipulations can include applying the first response and the second response to sample and hold circuits and applying outputs from the sample and hold circuits to a differential analog-to-digital converter such that an output of the differential analog-to-digital converter includes a measure of charge associated with the first and second responses. The first response and the second response can be coupled to the sample and hold circuits through a virtual earth amplifier. With the first response corresponding to a rising edge of the pulse and the second response corresponding to a falling edge of the pulse, the virtual earth amplifier outputs a negative pulse and a positive pulse, respectively, to the sample and hold circuits. Noise common to the rising edge and falling edge of the pulse can be removed by applying the outputs of the sample and hold circuits to a differential analog-to-digital converter.

Figure 5:
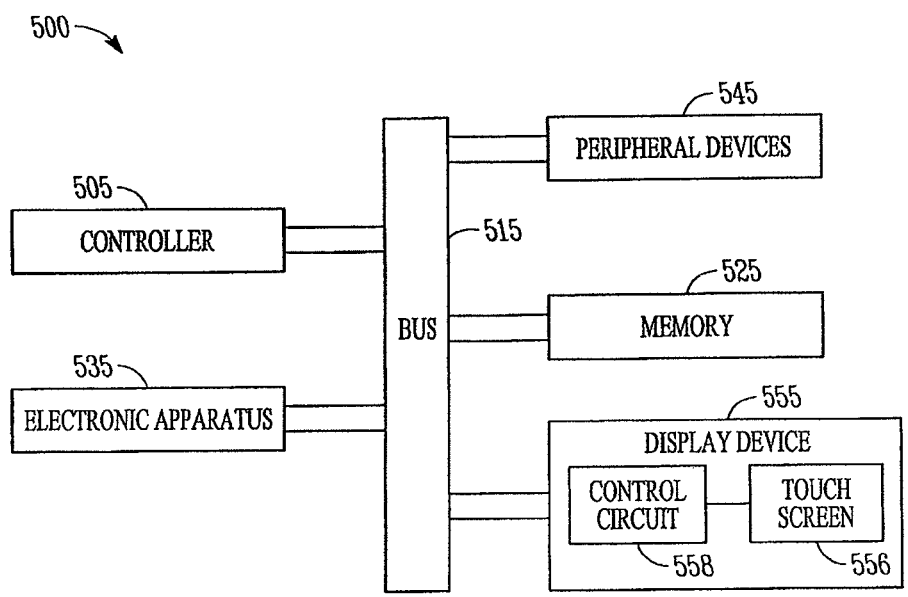
FIG. 5 shows a block diagram of a system having a controller and an apparatus including a touch screen and a circuit having an analog-to-digital converter for charge measurements in operation of the touch screen.

FIG. 5 shows a block diagram of a system 500 having a controller 505 and an apparatus, such as display device 555, including a touch screen 556 and a control circuit 558 having an analog-to-digital converter for charge measurements in operation of touch screen 556. The analog-to-digital converter can be configured with other circuit components to provide low frequency noise rejection in charge measurements from operation of touch screen 556. Touch screen 556 and control circuit 558 can be arranged according to various embodiments similar to or identical to those described herein. Controller 505 can be realized as a processor.

System 500 can be formed in various manners coupling the individual components of system 500 together or integrating the components into one or a number of units using conventional techniques. In various embodiments, system 500 also includes an electronic apparatus 535 and a bus 515. Bus 515 provides electrical conductivity between controller 505 and electronic apparatus 535, between controller 505 and a memory 525, and among the various components coupled to bus 515. In an embodiment, bus 515 includes an address bus, a data bus, and a control bus, each independently configured. In an alternative embodiment, bus 515 uses common conductive lines for providing one or more of address, data, or control, the use of which is regulated by controller 505. In various embodiment, memory 525 can include one or more memory types, such as but not limited to, a DRAM (Dynamic Random Access Memory), SRAM (Static Random Access Memory), flash memories, magnetic memories, other memory formats, and combinations thereof.

In various embodiments, additional peripheral device or devices 545 are coupled to bus 515. Peripheral devices 545 can include displays, imaging devices, printing devices, wireless devices, additional storage memory, control devices that can operate in conjunction with controller 505.

In various embodiments, system 500 includes display device 555 having touch screen 556 and control circuit 555, where control circuit 555 has an analog-to-digital converter configured for charge measurements from operation of the touch screen. Alternatively, control circuit 555 can be integrated with controller 505 or one or more other components of system 500 separate from touch screen 556. System 500 having a display device 555 includes, but is not limited to, fiber optic systems or devices, electro-optic systems or devices, optical systems or devices, imaging systems or devices, and information handling systems or devices such as wireless systems or devices, telecommunication systems or devices, and computers.

Although specific embodiments have been illustrated and described herein, it will be appreciated by those of ordinary skill in the art that any arrangement that is calculated to achieve the same purpose may be substituted for the specific embodiments shown. Various embodiments use permutations and/or combinations of embodiments described herein. It is to be understood that the above description is intended to be illustrative, and not restrictive, and that the phraseology or terminology employed herein is for the purpose of description.

What is claimed is:

1. A circuit comprising:
an amplifier having an output;
a first sample and hold circuit having an input and an output, the input of the first sample and hold circuit coupled to the output of the amplifier;
a second sample and hold circuit having an input and an output, the input of the second sample and hold circuit coupled to the output of the amplifier;
a differential analog-to-digital converter (ADC) having first and second inputs and an output, the first input of the differential ADC coupled to the output of the first sample and hold circuit, and the second input of the differential ADC coupled to the output of the second sample and hold circuit, the ADC operable to:
receive a first voltage offset from the first sample and hold circuit;
receive a second voltage offset from the second sample and hold circuit; and
measure a difference between the first voltage offset from the first sample and hold circuit and the second voltage offset from the second sample and hold circuit; and
a control unit operable to control a pulse generation based on the difference between the first voltage offset from the first sample and hold circuit and the second voltage offset from the second sample and hold circuit.

2. The circuit of claim 1, wherein the amplifier is operable to:
collect a first charge on a receive electrode of a touch screen and generate the first voltage offset of a first polarity in response to a first edge of a pulse on a drive electrode of the touch screen; and
collect a second charge on the receive electrode and generate the second voltage offset of a second polarity in response to a second edge of the pulse on the drive electrode of the touch screen.

3. The circuit of claim 2, wherein:
the first edge comprises a rising edge of the pulse applied to the drive electrode; and
the second edge comprises a falling edge of the pulse applied to the drive electrode.

4. The circuit of claim 2, wherein the differential ADC is operable to measure the difference by subtracting the first edge from the second edge, wherein the first edge is represented by $S_P$, where $S_P = -M + L$, and the second edge is represented by $S_N$, where $S_N = +M + L$, and where M is a measurement and L is a low frequency interference.

5. The circuit of claim 1, wherein the first sample and hold circuit is operable to hold a maximum value of the first voltage offset in a first direction.

6. The circuit of claim 1, wherein the second sample and hold circuit is operable to hold a maximum value of the second voltage offset in a second direction.

7. The circuit of claim 1, wherein the amplifier comprises a virtual earth amplifier.

8. A method comprising:
coupling an input of a first sample and hold circuit to an output of an amplifier;
coupling an input of a second sample and hold circuit to the output of the amplifier;
coupling an output of the first sample and hold circuit to a first input of a differential analog-to-digital converter (ADC);
coupling an output of the second sample and hold circuit to a second input of the differential ADC;
coupling an output of the differential ADC to an input of a control unit;
receiving, by the differential ADC, a first voltage offset from the first sample and hold circuit;
receiving, by the differential ADC, a second voltage offset from the second sample and hold circuit; and
measuring, by the differential ADC, a difference between the first voltage offset from the first sample and hold circuit and the second voltage offset from the second sample and hold circuit; and
controlling, by the control unit, a pulse generation based on the difference between the first voltage offset from the first sample and hold circuit and the second voltage offset from the second sample and hold circuit as measured by the differential ADC.

9. The method of claim 8, further comprising:
collecting, by the amplifier, a first charge on a receive electrode of a touch screen;
generating, by the amplifier, the first voltage offset of a first polarity in response to a first edge of a pulse on a drive electrode of the touch screen;
collecting, by the amplifier, a second charge on the receive electrode; and
generating the second voltage offset of a second polarity in response to a second edge of the pulse on the drive electrode of the touch screen.

10. The method of claim 9, wherein:
the first edge comprises a rising edge of the pulse applied to the drive electrode; and
the second edge comprises a falling edge of the pulse applied to the drive electrode.

11. The method of claim 9, further wherein measuring the difference comprises subtracting the first edge from the second edge, wherein the first edge is represented by $S_P$, where $S_P = -M + L$, and the second edge is represented by $S_N$, where $S_N = +M + L$, and where M is a measurement and L is a low frequency interference.

12. The method of claim 8, further comprising holding, by the first sample and hold circuit, a maximum value of the first voltage offset in a first direction.

13. The method of claim 8, further comprising holding, by the second sample and hold circuit, a maximum value of the second voltage offset in a second direction.

14. The method of claim 8, wherein the amplifier comprises a virtual earth amplifier.

15. A system comprising:
a matrix touch screen having an input line and an output line, the output line configured with respect to the input line to acquire a signal;
a circuit coupled to the output line of the matrix touch screen, the circuit comprising:
an amplifier having an input and an output, the input coupled to the output line of the matrix touch screen;
a first sample and hold circuit having an input and an output, the input of the first sample and hold circuit coupled to the output of the amplifier;
a second sample and hold circuit having an input and an output, the input of the second sample and hold circuit coupled to the output of the amplifier;
a differential analog-to-digital converter (ADC) having first and second inputs and an output, the first input of the differential ADC coupled to the output of the first sample and hold circuit, and the second input of the differential ADC coupled to the output of the second sample and hold circuit, the ADC operable to:

receive a first voltage offset from the first sample and hold circuit;

receive a second voltage offset from the second sample and hold circuit; and measure a difference between the first voltage offset from the first sample and hold circuit and the second voltage offset from the second sample and hold circuit; and a control unit operable to control a pulse generation based on the difference between the first voltage offset from the first sample and hold circuit and the second voltage offset from the second sample and hold circuit.

16. The system of claim 15, wherein the amplifier is operable to:

collect a first charge from a receive electrode of the matrix touch screen and generate the first voltage offset of a first polarity in response to a first edge of a pulse on a drive electrode of the touch screen; and collect a second charge from the receive electrode of the matrix touch screen and generate the second voltage offset of a second polarity in response to a second edge of the pulse on the drive electrode of the touch screen.

17. The system of claim 16, wherein:

the first edge comprises a rising edge of the pulse applied to the drive electrode of the matrix touch screen; and the second edge comprises a falling edge of the pulse applied to the drive electrode of the matrix touch screen.

18. The system of claim 16, wherein the differential ADC is operable to measure the difference by subtracting the first edge from the second edge, wherein the first edge is represented by $S_P$, where $S_P = -M+L$, and the second edge is represented by $S_N$, where $S_N = +M+L$, and where M is a measurement and L is a low frequency interference.

19. The system of claim 15, wherein:

the first sample and hold circuit is operable to hold a maximum value of the first voltage offset in a first direction; and the second sample and hold circuit is operable to hold a maximum value of the second voltage offset in a second direction.

20. The system of claim 15, wherein the amplifier comprises a virtual earth amplifier.

* * * * *